(12) United States Patent
Johansson

(10) Patent No.: US 7,682,919 B2
(45) Date of Patent: Mar. 23, 2010

(54) SEMICONDUCTOR PROCESS AND PMOS VARACTOR

(75) Inventor: Ted Johansson, Djursholm (SE)

(73) Assignee: Infineon Technologies AG, Neubiberg (DE)

( * ) Notice: Subject to any disclaimer, the term of this patent is extended or adjusted under 35 U.S.C. 154(b) by 788 days.

(21) Appl. No.: 10/829,694

(22) Filed: Apr. 22, 2004

(65) Prior Publication Data

US 2004/0198013 A1  Oct. 7, 2004

Related U.S. Application Data

(63) Continuation of application No. PCT/SE02/01914, filed on Oct. 21, 2002.

(30) Foreign Application Priority Data

Nov. 15, 2001  (SE)  .................................... 0103806

(51) Int. Cl.
 *H01L 21/331* (2006.01)
(52) U.S. Cl. ............................. 438/314; 257/E27.015; 257/E27.049; 257/E21.364
(58) Field of Classification Search ................ 438/142, 438/197, 202–205, 217, 220, 221–228, 309, 438/312, 313–316, 322, 326, 334, 338, 357, 438/379; 257/370, 378, 511, 525, E27.015, 257/E27.019, E27.037, E27.049, E21.364
See application file for complete search history.

(56) References Cited

U.S. PATENT DOCUMENTS 4,862,240 A * 8/1989 Watanabe et al. ........... 257/370
5,405,790 A * 4/1995 Rahim et al. ................ 438/202
6,455,902 B1 * 9/2002 Voldman ..................... 257/378

FOREIGN PATENT DOCUMENTS

| EP | 0 902 483 A1 | 9/1997 |
| SE | 0101567-6 | 12/2002 |
| WO | WO 98/53489 | 11/1998 |
| WO | WO 01/20664 | 3/2001 |

OTHER PUBLICATIONS

Jan Craninckx; "A Fully Integrated CMOS DCS-1800 Frequency Synthesizer"; IEEE Journal of Solid State Circuits, vol. 33, No. 12, Dec. 1998.
Pietro Andreani et al.; "On the Use of MOS Varactors in RF VCO's"; IEEE Journal of Solid-State Circuits, vol. 35, No. 6, Jun. 2000.
Ryan Bunch et al.; "A 0.35 μm CMOS 2.5 GHz Complementary—Gm VCO Using PMOS Inversion Mode Varactors"; IEEE Radio Frequency Integrated Circuits Symposium, 2001.

* cited by examiner

*Primary Examiner*—Brook Kebede
(74) *Attorney, Agent, or Firm*—SpryIP, LLC

(57) ABSTRACT

A method in the fabrication of an integrated circuit including a PMOS varactor and an npn transistor, comprises the steps of (i) simultaneously forming buried n+-doped regions (31) for the PMOS varactor and the npn transistor in a p-doped substrate (10, 41); (ii) simultaneously forming n-doped wells (41) above the buried n+-doped regions (31); (iii) simultaneously forming field isolation areas (81) around the n-doped regions (41); (iv) forming a PMOS gate region (111, 194) and a p-doped base each in a respective one of the n-doped wells (41); and (v) simultaneously forming n+-doped contacts to the buried n+-doped regions (31); the contacts being separated from the n-doped wells (41). Source and drain regions may be formed in the PMOS n-well (inversion mode) or the PMOS n+-doped contact may be formed in the PMOS n-well instead of being separated from there (accumulation mode).

26 Claims, 6 Drawing Sheets

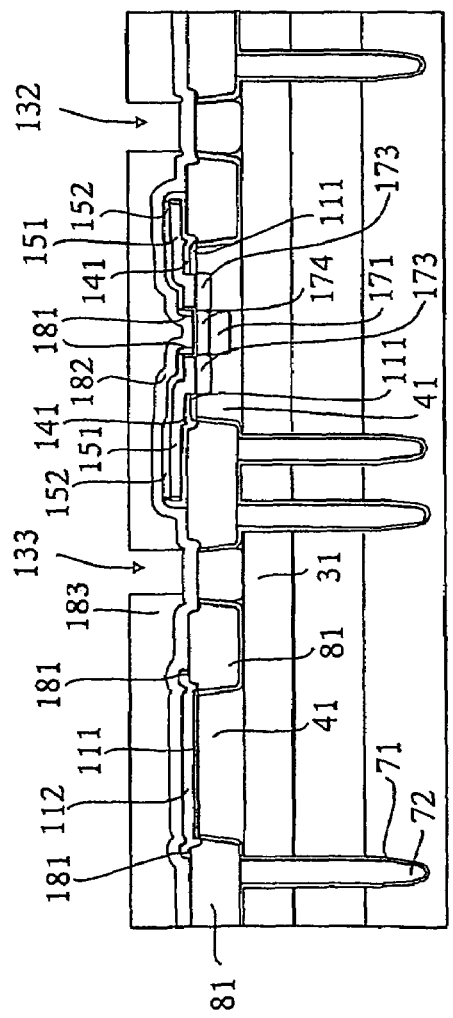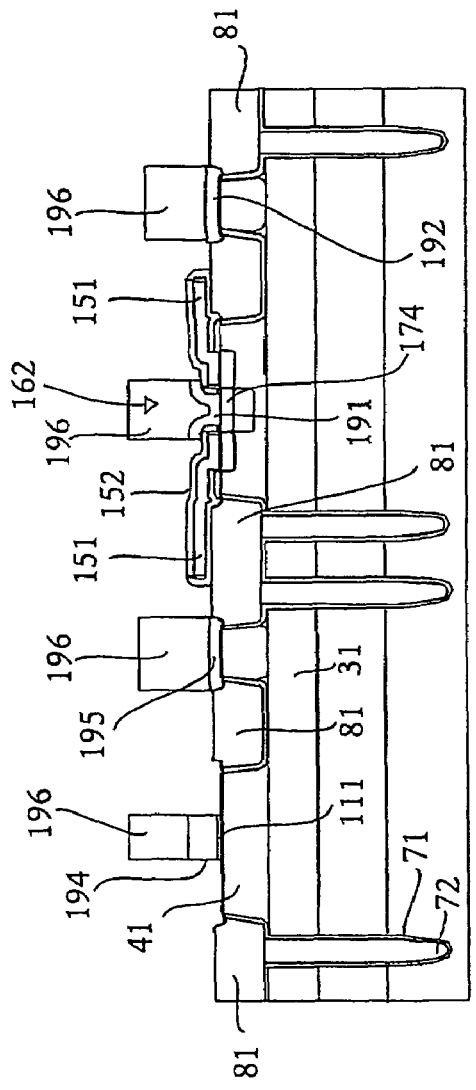

SEMICONDUCTOR PROCESS AND PMOS VARACTOR

CROSS REFERENCE TO RELATED APPLICATION

This application is a continuation of copending International Application No. PCT/SE02/01914 filed Oct. 21, 2002 which designates the United States, and claims priority to Swedish application no. 0103806-6 filed Nov. 15, 2001.

TECHNICAL FIELD OF THE INVENTION

The present invention generally relates to the field of silicon IC-technology, and more specifically the invention relates to the formation of a PMOS varactor in a semiconductor process flow, especially designed for bipolar RF-IC:s; to the PMOS varactor formed, and to an integrated circuit comprising such a PMOS varactor.

DESCRIPTION OF RELATED ART AND BACKGROUND OF THE INVENTION

Advanced silicon bipolar, CMOS or BiCMOS circuits are used today for high-speed applications in the 1-5 GHz frequency range, replacing circuits previously only possible to realize using III-V based technologies.

A common trend in microelectronics is to integrate more and more functions on a single chip, in order to increase the general performance and to reduce size, power consumption and price of the circuits. The versatility of a BiCMOS-process is many time preferred, although it is not suited for all applications. High-performance bipolar integrated circuits have been used extensively for some critical building blocks in telecommunication circuits, mainly for analog functions such as switching currents and voltages, and for high-frequency radio circuit functions such as those in mixers, amplifiers, and detectors. For high-performance cost-effective circuits that would be used in e. g. cellular telephones, a bipolar-only process is many times still to prefer, instead of a BiCMOS process.

For voltage-controlled oscillator (VCO) design, a varactor function, i. e. a voltage-controlled capacitance, is needed for tuning the frequency. It can be realized using the capacitance characteristics of a p/n-junction, which is available in any semiconductor process. In a bipolar process, the base/collector junction would be used, because of the larger capacitance variation, which is set by the doping ratio between the p- and n-side of the junction.

For high-performance VCO design, such as used in cellular systems, the phase-noise of the VCO is an important parameter. It is greatly influenced by the characteristics of the tuning varactor, mostly the Q-value of the varactor (which describes the parasitic losses of device). In M. Steyaert, J. Craninckx, "A fully integrated CMOS DCS-1800 frequency synthesizer", IEEE J. Solid-State Circuits, Vol. 33, p. 2054, Dec. 1998, the quality of the varactor, which consisted of the $p^+$/n-well junction capacitor in a CMOS process, prevented compliance with the phase-noise specifications over the whole tuning range for a DCS1800 system. Since the diode varactor leaves much to be desired, another way to realize the varactor is needed.

In P. Andreani, S. Mattisson, "On the Use of MOS Varactors in RF VCO's", IEEE J. Solid-State Circuits, Vol. 35, p. 905, Jun. 2000, different types of MOS varactors are studied for VCO-design. If carefully selecting the device parameters for the varactor, better results than for junction-based varactors are obtained.

Different types of MOS varactors for integration in a conventional CMOS process are described in EP 0902483 A1, as well as many design parameters for practical application of the varactors.

However, for high-performance radio applications where bipolar RF-IC processes are still preferred there is also a need to realize varactors having improved performance.

SUMMARY OF THE INVENTION

Accordingly, it is an object of the present invention to provide a method in the fabrication of an integrated circuit, particularly an integrated circuit for radio frequency applications, including a PMOS varactor, a vertical bipolar npn transistor, and optionally other p-type MOS devices, wherein a minimum of processing steps are added to a pure bipolar process.

In this respect there is a particular object of the invention to provide such a method, which includes a number of multi-purpose processing steps.

It is a further object of the invention to provide such a method, which produces a PMOS varactor having improved performance, preferably a higher Q value.

To this end the present invention comprises according to a first aspect a method in the fabrication of an integrated circuit including a PMOS varactor and an npn transistor, which includes the steps of:

(i) simultaneously forming buried $n^+$-doped regions for the PMOS varactor and the npn transistor in a p-doped substrate;

(ii) simultaneously forming n-doped wells above the buried $n^+$-doped regions;

(iii) simultaneously forming field isolation areas around the n-doped wells;

(iv) forming a PMOS gate region on a first one of the n-doped wells;

(v) forming a $p^+$-doped base in a second one of the n-doped wells and an n-doped emitter in the base; and (v) simultaneously forming $n^+$-doped contacts to the buried $n^+$-doped regions; the contacts being separated from the n-doped wells.

Finally, the PMOS gate region and the PMOS $n^+$-doped contact are each connected to a respective terminal.

The field isolation areas are formed as shallow trenches filled with e. g. oxide. Advantageously, the field isolation areas are formed such that they extend vertically from an upper surface of the substrate and down into the buried $n^+$-doped regions and/or are formed with respect to the buried $n^+$-doped regions such that the buried $n^+$-doped regions extend into areas located underneath the field isolation areas.

To achieve further device isolation, deep trenches may simultaneously be formed around the buried $n^+$-doped regions, where the deep trenches extend deeper down into the substrate than the buried $n^+$-doped regions.

P-doped source and drain regions may be formed in the n-doped region above the buried $n^+$-doped region for the PMOS varactor, and this is preferably performed simultaneously with doping of an extrinsic base for the npn transistor.

The PMOS varactor has a capacitance value dependent on the voltage applied between the PMOS $n^+$-doped contact terminal, i. e. the bulk terminal, and the PMOS gate terminal. If the source and drain regions are connected to the bulk and the voltage is higher, or preferably much higher, than the threshold voltage of the transistor the varactor is said to be in inversion mode or region, i. e. an inversion channel with mobile holes builds up. If on the other hand the gate voltage is kept higher than the bulk voltage the PMOS varactor enters the accumulation mode or region.

The ensure operation in inversion mode, the source and drain regions are left floating, i. e. not contacted, and to ensure operation in accumulation mode, the source and drain regions are not formed at all.

Further, the above-mentioned objects are according to a second aspect of the invention, fulfilled by a method including the following steps:

(i) forming a buried $n^+$-doped region for the npn transistor in a p-doped substrate;

(ii) simultaneously forming in the substrate an essentially n-doped well for the PMOS varactor and an n-doped well above the buried $n^+$-doped region for the npn transistor;

(iii) simultaneously forming field isolation areas around the n-doped wells;

(iv) forming a PMOS gate region on the essentially n-doped well;

(v) forming a p-doped base in the n-doped well above the buried $n^+$-doped region for the npn transistor and an n-doped emitter in the p-doped base;

(vi) forming an n-doped collector contact to the buried $n^+$-doped region for the npn transistor; and (vii) forming one or preferably two $n^+$-doped regions in the essentially n-doped well for the PMOS varactor, the $n^+$-doped region(s) being separated from, in a horizontal plane, the PMOS gate region.

Finally, a gate terminal connected to the PMOS gate region and a bulk terminal connected to the $n^+$-doped region (s) are formed.

Preferably, the $n^+$-doped regions are formed on each side of the PMOS gate region. The PMOS varactor fabricated according to the second aspect of the invention is advantageously arranged to operate in accumulation mode.

Further, the present invention includes according to a third aspect a PMOS varactor fabricated in accordance with anyone of the first two aspects of the invention.

Still further, the present invention includes according to a fourth aspect an integrated circuit such as a VCO comprising at least one of the varactor according to the third aspect of the invention.

Further characteristics of the invention and advantages thereof will be evident from the detailed description of preferred embodiments of the present invention given hereinafter and the accompanying FIGS. 1-11, which are given by way of illustration only, and thus are not limitative of the present invention.

BRIEF DESCRIPTION OF THE DRAWINGS

FIGS. 1-8 are highly enlarged cross-sectional views of a portion of a semiconductor structure during processing according to a preferred embodiment of the present invention.

DETAILED DESCRIPTION OF EMBODIMENTS

A method of manufacturing a PMOS varactor in a bipolar process, to which only a few process steps are added, is overviewed below with reference to FIGS. 1-8. To illustrate the process the simultaneous formations of a bipolar transistor is also described.

Figure 1:
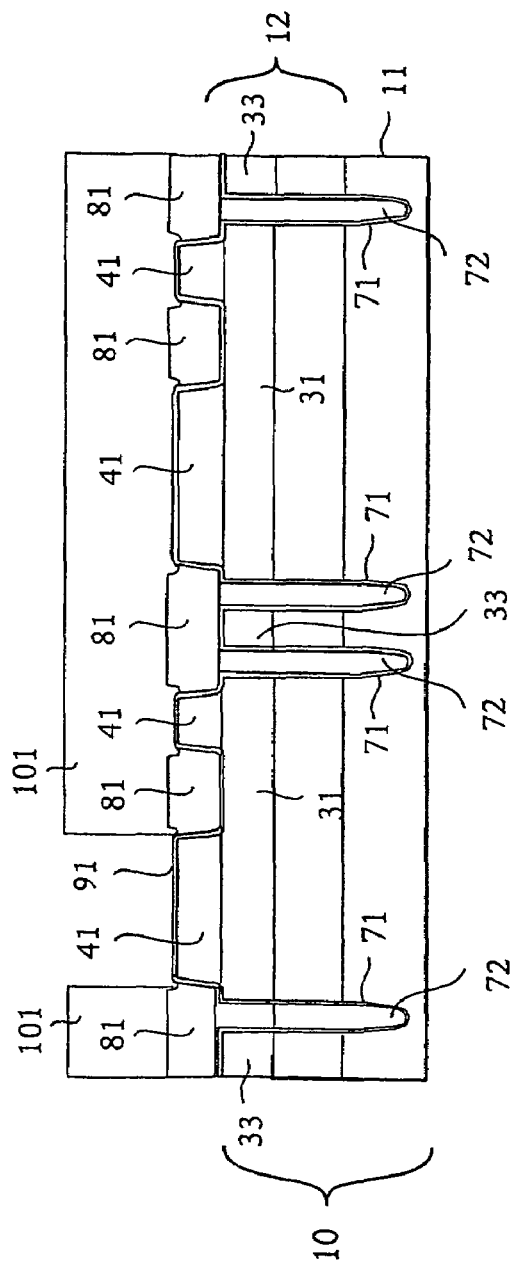

To reach a structure as the one illustrated in FIG. 1 a start material 10 consisting of a highly $p^+$-doped wafer 11 is provided, on which a low-doped epitaxial silicon layer 12 of p-type is grown. Alternatively, the p-type wafer can be a homogeneously low-doped p-type wafer (not illustrated).

In the surface layer 12 buried n-doped 31 and p-doped 33 regions are formed by means of (i) forming a thin protective layer of silicon dioxide on the layer 12; (ii) forming a mask thereon by photolithographic methods to define areas for the PMOS varactor and the bipolar transistor, respectively; (iii) $n^+$-type doping the areas defined by the mask; (iv) removing the mask; (v) heat treating the structure obtained;(vi) optionally p-type doping in additional areas of the structure; and (vii) exposing the upper surfaces of regions 31 and 33. The regions 31 are also referred to as buried $n^+$-doped layers.

Thereafter, an epitaxial silicon layer 41 is grown on the surface, which layer is doped in selected regions to obtain regions of n- and p-type (n-wells and p-wells). In FIG. 1 all regions 41 are n-type doped.

Alternatively, instead of providing the wafer 11 and forming the epitaxial layers 12 and 41, a single homogenous wafer may be provided, in which the buried regions 31 and 33 are formed by means of ion implantation at high energy and in which n-and optionally p-type doped surface regions 41 are formed by means of ion implantation. The term "substrate" as used herein is intended to mean a wafer, on which optionally a number of epitaxial layers have been grown.

In order to isolate the various regions 41 shallow and optionally deep trenches, 81 and 72, are formed to surround the respective regions 41.

The shallow trenches 81 are formed by the steps of (i) forming a hard mask by means of oxidizing the silicon surface; depositing a silicon nitride layer; patterning and etching away the silicon nitride and oxide layers at areas where the trenches are to be formed; and (ii) etching silicon, to form the structure. The shallow trenches are reoxidized and filled with a deposited oxide 81 subsequently to deep trench filling, see below.

The shallow trenches can be formed such that they extend vertically from the upper silicon surface, i. e. the upper surface of silicon layer 41, and down to the buried $n^+$-doped layer regions 31, and preferably further down into the buried $n^+$-doped layer 31 (not illustrated in FIGS. 1-8). Further, the buried $n^+$-doped layers 31 and the shallow trenches can be formed relative each other such that the buried $n^+$-doped layers 31 extend into areas located underneath the shallow trenches.

Note that the n-wells 41 may be formed by ion implantation through the above-mentioned silicon nitride and oxide layers, and p-wells may be performed at yet a later stage in the process.

The deep trenches 72 are formed by the steps of (i) forming a hard mask for the deep trenches by depositing a silicon dioxide layer; and patterning and etching this silicon dioxide layer to define openings for the deep trenches; (ii) etching the deep trenches; (iii) removing the remaining portions of the oxide hard mask layer; (iv) growing a thin oxide on top of the structure; (v) filling the deep trenches with deposited oxide (the thin oxide and the deposited oxide being together denoted by 71) and polysilicon 72; (vi) optionally planarizing the polysilicon; and (vii) etching back to remove all polysilicon from the shallow trench areas.

Subsequently thereto, the shallow trenches are filled with the oxide 81, whereupon the nitride and oxide layers, covering active areas 41, are removed.

The isolation scheme is further described in the international publication WO 0120664 and in the Swedish patent application No. 0101567-6, both of which being hereby incorporated by reference.

Next, a thin oxide 91, called p-well oxide, is grown, whereafter p-wells are optionally formed (not illustrated). Finally, a photo mask 101 is formed on the structure, which is open on the areas, which shall serve as device areas for the PMOS device, see FIG. 1, this being a first step added to a pure bipolar process.

The wafer is then implanted with a p-type dopant. The energy is selected such that the dopant penetrates the areas not covered by the photo mask, but which are covered by thin oxide; and the dose is selected to adjust the threshold voltage (VTP) such that it will be in the −0.5 to −1.5 V range. Subsequently, the photo mask 101 is removed.

Figure 2:
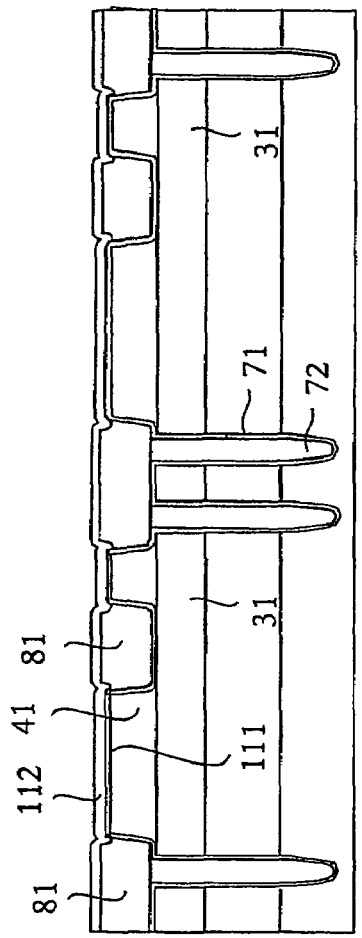

The p-well oxide 91 is preferably replaced by a gate oxide 111 on top of the structure using oxide etching followed by thermal oxidation. This oxide renewal is due to high MOS requirements, as the quality of the p-well oxide is normally not sufficient after being subjected to ion implantation. Following directly, a first undoped poly-crystalline or non-crystalline silicon layer 112 is deposited on the gate oxide 111. The resulting structure is shown in FIG. 2.

Figure 3:
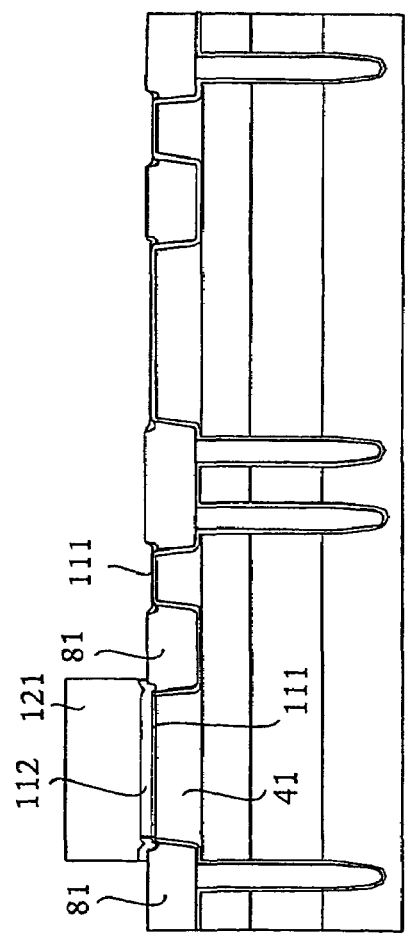

The deposited silicon layer 112 needed to form part of the PMOS gate must now be removed from the other areas of the wafer. Thus, a photo mask 121, which covers the PMOS device areas is applied to the wafer. Using mask 121 silicon is removed by etching, using the field oxide/gate oxide 81/111 as etch stop. The resulting structure is shown in FIG. 3. The photo mask is then removed using conventional methods.

For the formation of the active devices low-resistance paths, i. e. collector contacts or "plugs", from the surface of the wafer to the buried n$^+$-doped layer 31 are needed. The paths are defined lithographically, by applying a mask 131 having open areas 132 and 133 for forming plugs for the PMOS varactor and the bipolar transistor, respectively. Doping of n-type is performed through the open areas 132 and 133. Details of the selection of energy and doses are discussed in WO 9853489, which publication being hereby incorporated by reference.

Figure 4:
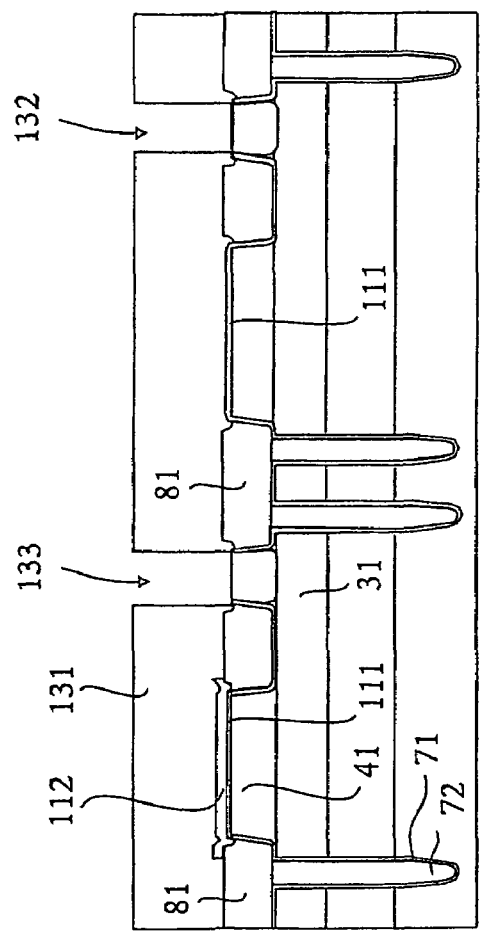

After the implantation, still having the photo mask 131 present on the wafer, the thin protective silicon dioxide layer 111 is removed in the open areas. The resulting structure is shown in FIG. 4. The photo mask 131 is then removed by conventional methods, after which the wafer is optionally given a heat treatment.

Subsequently, a thin silicon nitride layer is deposited (remaining portions thereof denoted by 141 in FIG. 5), the purpose of which is threefold: (i) to add to the insulator layer deposited in the active area of the bipolar transistor resulting in lower parasitic capacitance for the base-collector junction; (ii) to encapsulate the gate layer 112 of the PMOS varactor during subsequent processing; and (iii) to serve as an oxidation-resistant mask for the collector plugs 41 (in openings 132 and 133 in FIG. 4) and the gate layer 112 of the PMOS varactor.

Next follow a number of process steps in the fabrication of the bipolar npn transistor including (i) formation of an emitter/base opening; (ii) formation of an extrinsic base layer 151; (iii) formation of an oxide layer 152; (iv) formation of an emitter opening within the emitter/base opening; (v) optional formation of a secondary implanted collector 171; (vi) formation of p-type base contact paths 173; (vii) formation of an intrinsic base 174; (viii) formation of nitride sidewall spacers 181; and (ix) formation of a n-type doped polysilicon layer 182 for the emitter contact. Firstly in step (viii) above, i. e. during formation of nitride sidewall spacers 181, the thin silicon nitride layer 141 is removed on field areas, the diffused n$^+$-doped contact areas and on PMOS areas. Next, a mask 183 is applied, the mask 183 having openings 132 and 133 for the n$^+$-doped plugs, through which additional n-type dopant is implanted. The resulting structure is illustrated in FIG. 5.

Thereafter, the mask is removed. Other, non-illustrated areas, which will form resistors in the polysilicon layer, may be defined by the mask 183 during implantation.

Next, an emitter contact 191 and a collector contact 192 of the npn transistor, a gate 194 and a diffused n$^+$-doped contact 195 of the PMOS varactor, and resistors (not explicitly illustrated) are formed by means of patterning the structure by a mask 196 and etching the polysilicon layer 182 (and 112 at the PMOS varactor). The structure obtained is illustrated in FIG. 6. After the etching the mask 196 is removed.

Figure 7:
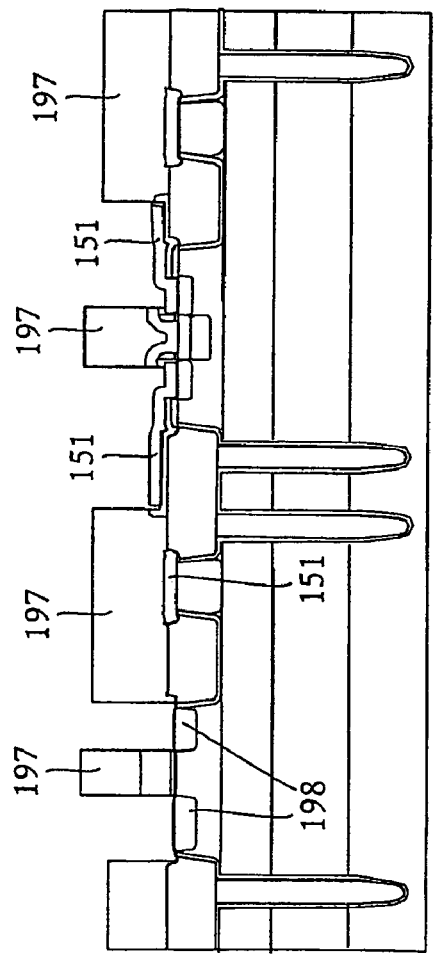

Thereafter, the oxide layer 152 on top of the p-type polysilicon layer 151 is removed by means of applying a photo mask 197 and etching until the polysilicon is exposed in the openings of the photo mask 197. After etching an additional p-type dopant implant is performed to dope the respective source and drain areas 198 of the PMOS varactor and the extrinsic base 151 of the bipolar transistor. A resultant structure is shown in FIG. 7. After completed etching and implantation the photo mask 197 is removed.

Figure 8:
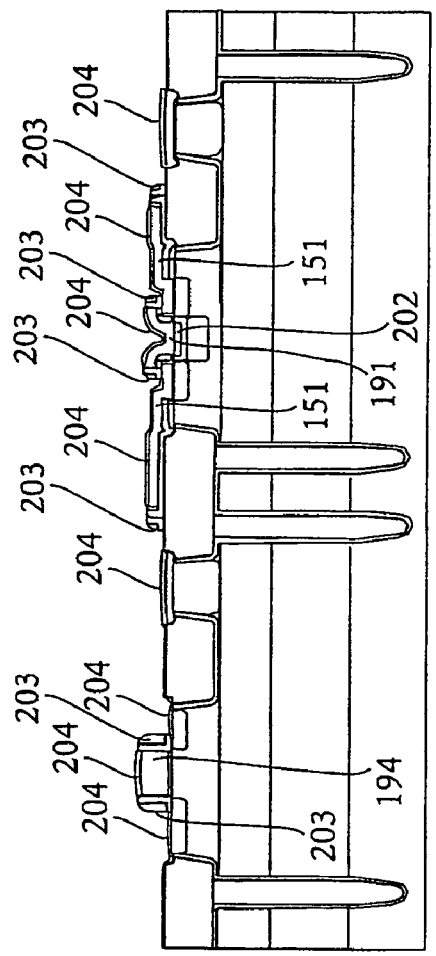

Next, emitter activation and drive-in is performed to create n-type doped emitter region 202. Prior to this activation, a thin oxide layer or nitride-oxide bi-layer is formed on the structure, which layer is subsequently etched anisotropically, such that spacers 203 are formed. Thereafter, exposed silicon surfaces may be provided with silicide 204 in a self-aligned manner (SALICIDE) to reduce the resistance. The resulting structure is shown in FIG. 8. The process then continues with formation of passivation and metal layers.

Below, a number of varactor structures will be described with reference to FIGS. 9-12, which all are fabricated using the described process flow, with only a few modifications of the layouts or connections of the terminals.

Figure 9:
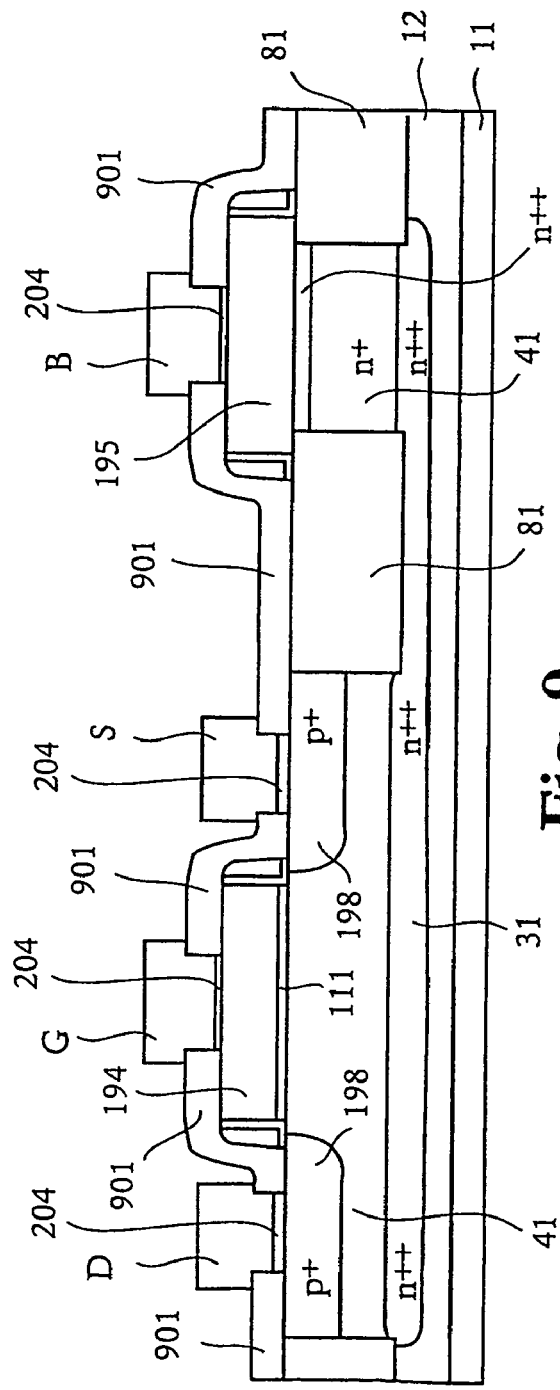
FIGS. 9-12 are highly enlarged cross-sectional views of PMOS varactors according to yet further embodiments of the present invention.

In FIG. 9 is shown a PMOS varactor resulting from the above-described fabrication process. The p$^+$-doped drain and source regions 198, the gate 111, 194, and the bulk 41 are each provided with a schematically indicated metal contact or terminal D, G, S and B in holes formed in a insulating passivation layer 901.

In a first version of the PMOS varactor, the drain, source and bulk terminals D, S and B are connected to a common electric potential $V_B$ and constitute a first electrode of the PMOS varactor and the gate terminal G, constituting a second electrode of the PMOS varactor, is connected to an electric potential $V_G$. Depending on the voltage across the PMOS varactor $V_{BG}=V_B-V_G$, five different regions or modes of operation can be distinguished: strong inversion, moderate inversion, weak inversion, depletion, and accumulation, see the above mentioned article by P. Andreani et al., which article being hereby incorporated by reference.

In a second varactor version, the drain and source terminals D and S (of the first version) are left floating, i. e. not contacted at all, to achieve a PMOS varactor suitable for operating in inversion mode. The voltage-dependent capacitance is obtained by connecting the bulk terminal B to the highest potential in the circuit (e. g. $V_{dd}$), while the gate terminal G voltage is variable and connected to the lower electric potential.

In a third varactor version, a PMOS varactor suitable for operating in accumulation mode is achieved by completely omitting the drain and source regions 198, and their respective terminals D and S. Thus, the mask 197 (illustrated in FIG. 7) covers suitably the drain and source regions 198 such that no implantation, and thus formation, thereof will be taken place.

Figure 10:
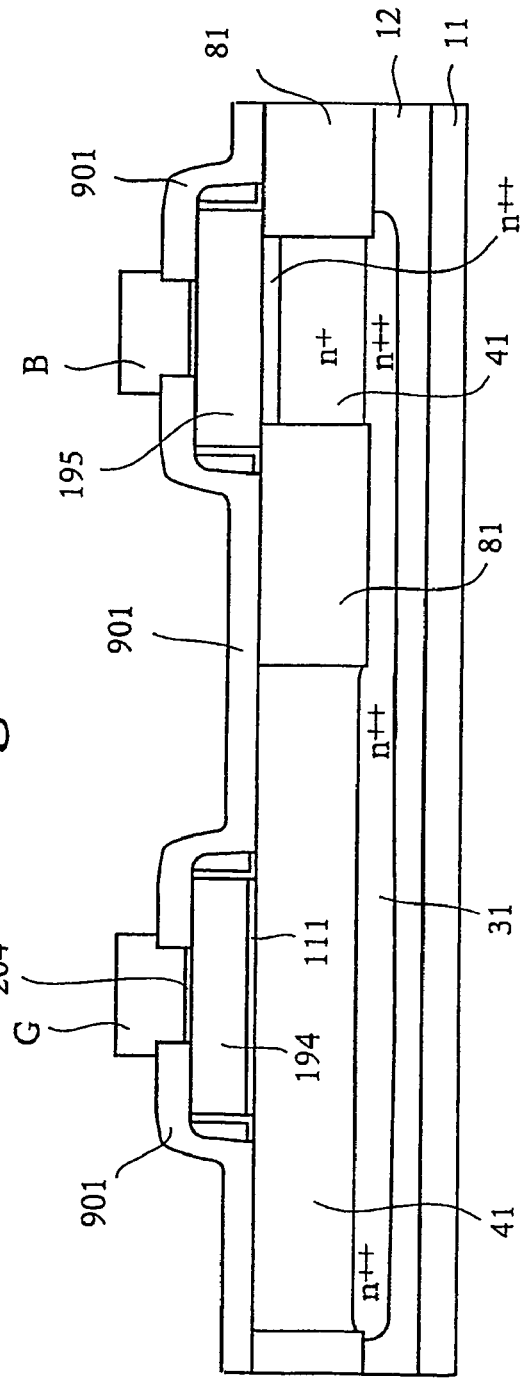

Such a PMOS varactor is illustrated in FIG. 10.

A potential drawback of this design is that the parasitic resistance on the side of the bulk terminal B (equivalent to the collector contact of the npn transistor) becomes high. To achieve an optimal structure the diffused n$^+$-doped contact 41, 151 needs to be placed closer to the gate structure 111, 194.

Figure 11:
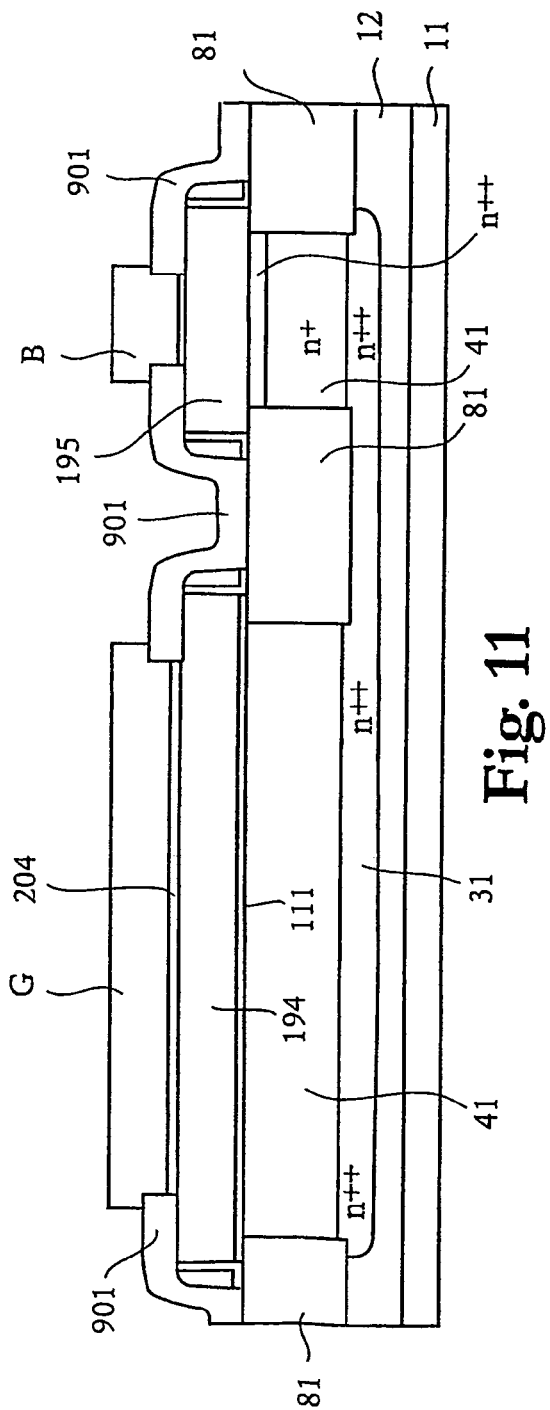

In FIG. 11 is shown a fourth varactor version having an improved structure, which is similar to the FIG. 10 version but which has a much longer gate structure 111, 194, the length of which being similar to the length of the n-well 41. Hereby, a reduced resistance and increased capacitance values are obtainable.

Figure 12:
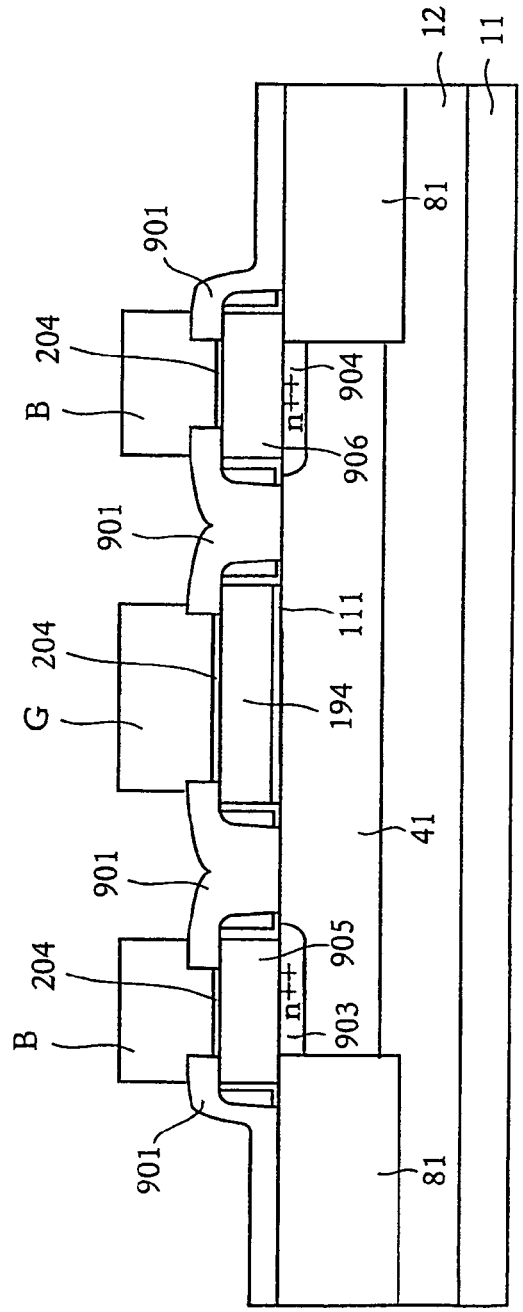

In FIG. 12 is shown a fifth varactor version having an improved structure. The PMOS gate structure 111, 194 is shown in the middle. At each side, n-doped n-well contact regions 903, 905 and 904, 906 are formed as close as possible to the gate edge. The n-doped contact regions are each comprised of an n$^{++}$-doped diffused region 903, 904, on top of which an n-doped polysilicon layer 905, 906 is located. Note that no buried n$^+$-doped layer is needed, but can nevertheless be provided (not illustrated in FIG. 12). The FIG. 12 varactor structure may be achieved by modifying the process as described above with reference to FIGS. 1-8 in the following manner.

If no buried n$^+$-doped layer shall be formed for the PMOS varactor, the photolithographic mask defining buried n$^+$-doped layer regions for the bipolar transistor shall cover the PMOS varactor area such that non$^+$-type doping 31 will be performed there.

The layout of the gate region 111, 194 has to be made such that the n-well 41 of the PMOS varactor extends in the plane of the cross sectional drawings beyond the gate region 111, 194 to make place for the n-doped contact regions 903, 905 and 904, 906. Further, some masks, including masks 131 and 183, have to be modified such that no diffused n$^+$-doped contact 41, 151 for the PMOS varactor will be formed. The mask 196, which defines the emitter contact 191 of the npn transistor and the gate structure 194 of the PMOS varactor, will be used to also define the n$^{++}$-doped polysilicon layers 905, 906 at each side of the gate structure 194, and thus the contact layers 905, 906 are formed during etching of the polysilicon layer 182.

Thereafter, the n$^{++}$-doped diffused regions 903 and 904 are formed by means of diffusion of n-type dopant from the contact layer 905, 906 during the emitter activation and drive-in. The mask 197 will then cover the areas where the drain and source regions would be formed (see FIG. 7). Finally, a gate contact or terminal G for the gate structure 111, 194, and bulk contacts or terminals B for the n-doped contact regions 903, 905 and 904, 906 are formed, the bulk terminals being interconnected. It shall be appreciated that the n$^{++}$-doped regions 903, 904 may alternatively, or complementary, be formed during other process steps where n-type dopant is being implanted.

In a typical design the electrodes, i. e. the gate structure 111, 194 and the bulk contacts 903, 905 and 904, 906 may be rectangular and have a length, i. e. a horizontal dimension in the plane of the cross-sectional drawings, in the size of a few microns or less, and a width, i. e. a horizontal dimension orthogonal the plane of the cross-sectional drawings, in the size of some tens of microns or more.

To increase the device isolation and reduce crosstalk, deep trenches may surround the respective structure (as illustrated in FIGS. 1-8, but not in FIGS. 9-12), although they are not strictly necessary for device isolation only. Thus, the process sequence for the deep trenches described with reference to FIGS. 1-8 may be omitted.

By means of the present invention varactors having an increased quality factor can be fabricated in a pure bipolar RF-IC process, to which only a few process steps have been added.

It will be obvious that the invention may be varied in a plurality of ways. Such variations are not to be regarded as a departure from the scope of the invention. All such modifications as would be obvious to one skilled in the art are intended to be included within the scope of the appended claims.

I claim:

1. A method in the fabrication of an integrated circuit including a PMOS varactor and a vertical bipolar npn transistor, said method comprising the steps of:
   providing a p-doped substrate;
   simultaneously forming a buried n+-doped region for the PMOS varactor and a buried n+-doped region for the npn transistor in said substrate;
   simultaneously forming in said substrate an essentially n-doped region above the buried n+-doped region for the PMOS varactor and an n-doped region above the buried n+-doped region for the npn transistor;
   simultaneously forming field isolation areas, in a horizontal plane, around said n-doped regions;
   forming a PMOS gate region on said essentially n-doped region for the PMOS varactor;
   forming a p-doped base in the n-doped region above the buried n+-doped region for the npn transistor and an n-doped emitter in the p-doped base;
   simultaneously forming an n-doped contact to the buried n+-doped region for the PMOS varactor and an n-doped collector contact to the buried n+-doped region for the npn transistor; said contacts being separated from, in a horizontal plane, said n-doped regions; and
   forming a gate terminal connected to the PMOS gate region and a bulk terminal connected to the n-doped bulk contact.

2. The method as claimed in claim 1, wherein said p-doped substrate includes a bulk material and at least one epitaxial layer formed thereon.

3. The method as claimed in claim 1, wherein said field isolation areas are formed as shallow trenches filled with oxide.

4. The method as claimed in claim 1, wherein said field isolation areas are formed such that they extend vertically from an upper surface of said substrate and down into the buried n+-doped regions.

5. The method as claimed in claim 1, wherein said field isolation areas are formed with respect to the buried n+-doped regions such that the buried n+-doped regions extend into areas located underneath the field isolation areas.

6. The method as claimed in claim 1, wherein said PMOS gate region is formed as a silicon layer on top of an oxide layer.

7. The method as claimed in claim 1, wherein said essentially n-doped region for the PMOS varactor is ion implanted with p-type dopant prior to the formation of said PMOS gate region to adjust the threshold voltage of the PMOS varactor.

8. The method as claimed in claim 1, wherein deep trenches are simultaneously formed around, in a horizontal plane, said buried n+-doped regions, said deep trenches extending deeper down into the substrate than said buried n+-doped regions.

9. The method as claimed in claim 1, wherein p-doped source and drain regions are formed in said essentially n-doped region above the buried n+-doped region for the PMOS varactor.

10. The method as claimed in claim 9, wherein an extrinsic base for the npn transistor is formed, said extrinsic base being p-doped simultaneously with the formation of said p-doped source and drain regions.

11. The method as claimed in claim 9, wherein a source contact connected to the source region and a drain contact connected to the drain region are formed.

12. The method as claimed in claim 11, wherein said source and drain contacts are connected to said bulk terminal.

13. The method as claimed in claim 9, wherein said source and drain regions are left not-contacted.

14. The method as claimed in claim 1, wherein said PMOS varactor is formed and connected to operate in inversion mode.

15. The method as claimed in claim 1, wherein said PMOS varactor is formed and connected to operate in accumulation mode.

16. A method in the fabrication of an integrated circuit including a PMOS varactor and a vertical bipolar npn transistor, said method comprising the steps of:
    providing a p-doped substrate;
    forming a buried n+-doped region for the npn transistor in said substrate;
    simultaneously forming in said substrate an essentially n-doped region for the PMOS varactor and an n-doped region above the buried n+-doped region for the npn transistor;
    simultaneously forming field isolation areas around, in a horizontal plane, said n-doped regions;
    forming a PMOS gate region on said essentially n-doped region for the PMOS varactor;
    forming a p-doped base in the n-doped region above the buried n+-doped region for the npn transistor and an n-doped emitter in the p-doped base;
    forming an n-doped collector contact to the buried n+-doped region for the npn transistor; said contact being separated from, in a horizontal plane, said n-doped regions;
    forming at least one n+-doped region in said essentially n-doped region for the PMOS varactor, said at least one n+-doped region being separated from, in a horizontal plane, said PMOS gate region; and
    forming a gate terminal connected to the PMOS gate region and a bulk terminal connected to said at least one n+-doped region.

17. The method as claimed in claim 16, wherein a buried n+-doped region for the PMOS varactor is formed simultaneously with the formation of said buried n+-doped region for the npn transistor in said substrate; and said essentially n-doped region is formed subsequently above the buried n+-doped region for the PMOS varactor.

18. The method as claimed in 16, wherein an n+-doped polycrystalline layer connected to said at least one n+-doped region is formed.

19. The method as claimed in claim 18, wherein said n+-doped polycrystalline layer is connected to said bulk terminal.

20. The method as claimed in claim 18, wherein an emitter contact connected to said n-doped emitter for the npn transistor is formed simultaneously with said formation of said n+-doped polycrystalline layer.

21. The method as claimed in claim 16, wherein a second n+-doped region is formed in said essentially n-doped region above the buried n+-doped region for the PMOS varactor, said second n+-doped region being separated from, in a horizontal plane, said PMOS gate region.

22. The method as claimed in claim 21, wherein said n+-doped regions are formed on each side of said PMOS gate region.

23. The method as claimed in claim 16, wherein said PMOS varactor is formed and connected to operate in accumulation mode.

24. A PMOS varactor fabricated in accordance with the method of claim 1.

25. An integrated circuit including a vertical bipolar npn transistor, said integrated circuit comprising the PMOS varactor as claimed in claim 24.

26. The integrated circuit of claim 25 wherein said integrated circuit is an integrated circuit adapted for radio frequency applications.

* * * * *